United States Patent [19]

Schowe

[11] Patent Number: 5,315,181

[45] Date of Patent: May 24, 1994

[54] CIRCUIT FOR SYNCHRONOUS, GLITCH-FREE CLOCK SWITCHING

[75] Inventor: Lester Schowe, Longmont, Colo.

[73] Assignee: Maxtor Corporation, San Jose, Calif.

[21] Appl. No.: 87,980

[22] Filed: Jul. 7, 1993

[51] Int. Cl.$^5$ .................... H03K 19/096; H03K 5/13
[52] U.S. Cl. .................................. 307/480; 307/269;
328/63
[58] Field of Search ............... 307/443, 480, 243, 269;
328/60, 63

[56] References Cited

U.S. PATENT DOCUMENTS

| | | | |
|---|---|---|---|
| 4,229,699 | 10/1980 | Frissell | 307/243 |
| 4,853,653 | 8/1989 | Maher | 328/63 |
| 4,855,615 | 8/1989 | Humpleman | 307/480 |
| 4,899,351 | 2/1990 | Bonke | 307/269 |
| 4,970,405 | 11/1990 | Hagiwara | 328/63 |
| 5,099,140 | 3/1992 | Mudgett | 307/480 |

OTHER PUBLICATIONS

Wakerly, John F., "Digital Design: Prnciples and Practice"; ©1989 by John F. Wakerly; pp. 264, 265, 268 and 269.

Primary Examiner—Edward P. Westin
Assistant Examiner—Benjamin D. Driscoll
Attorney, Agent, or Firm—Blakely, Sokoloff, Taylor & Zafman

[57] ABSTRACT

A circuit for synchronously selecting either a first or a second input clock signal as an output clock signal includes first and second logic means. The first logic means outputs a first clock signal when an internal control signal is at a first predetermined logic level, while the second logic means outputs a second input clock signal when the internal control signal is at a second predetermined logic level. A control logic means is utilized to select either the first or the second input clock signal as the output of the circuit by coupling the first input clock signal from the first logic means to the output when an input select signal is in a logic state. The second input clock signal is coupled to the output when the input select signal is in a second logic state. The control logic means generates the internal control signal in response to the input select signal. A transition of the input select signal from the first logic state to the second logic state causes the internal control signal to transition from the first predetermined logic level to the second predetermined logic level synchronous with the output clock signal. At the same time, the transition causes the control logic means to freeze the output before synchronously coupling the second input clock signal to the output such that the switching of the output clock signal from the first input clock to the second input clock signal occurs without glitching.

3 Claims, 2 Drawing Sheets

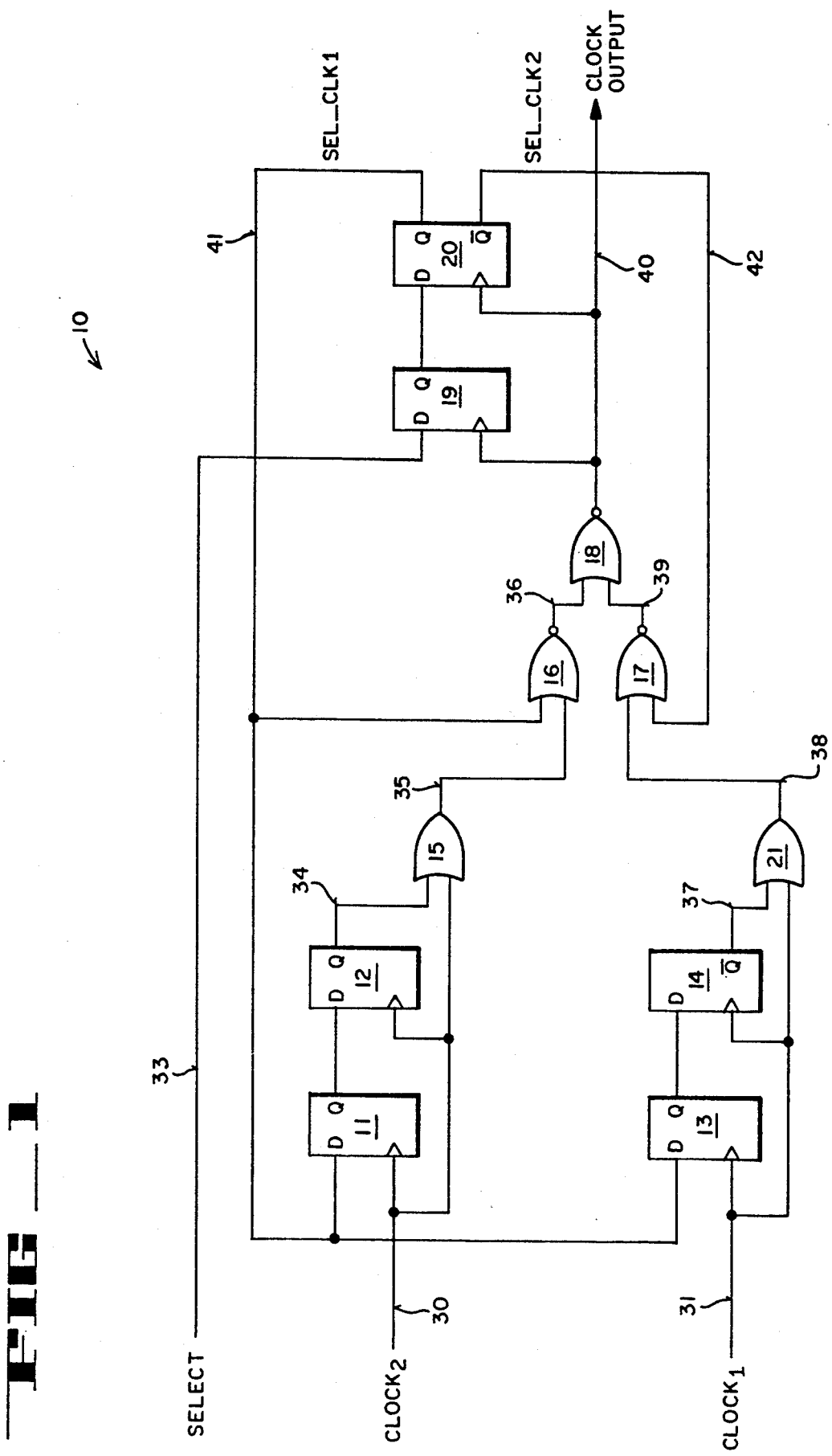
FIG—1

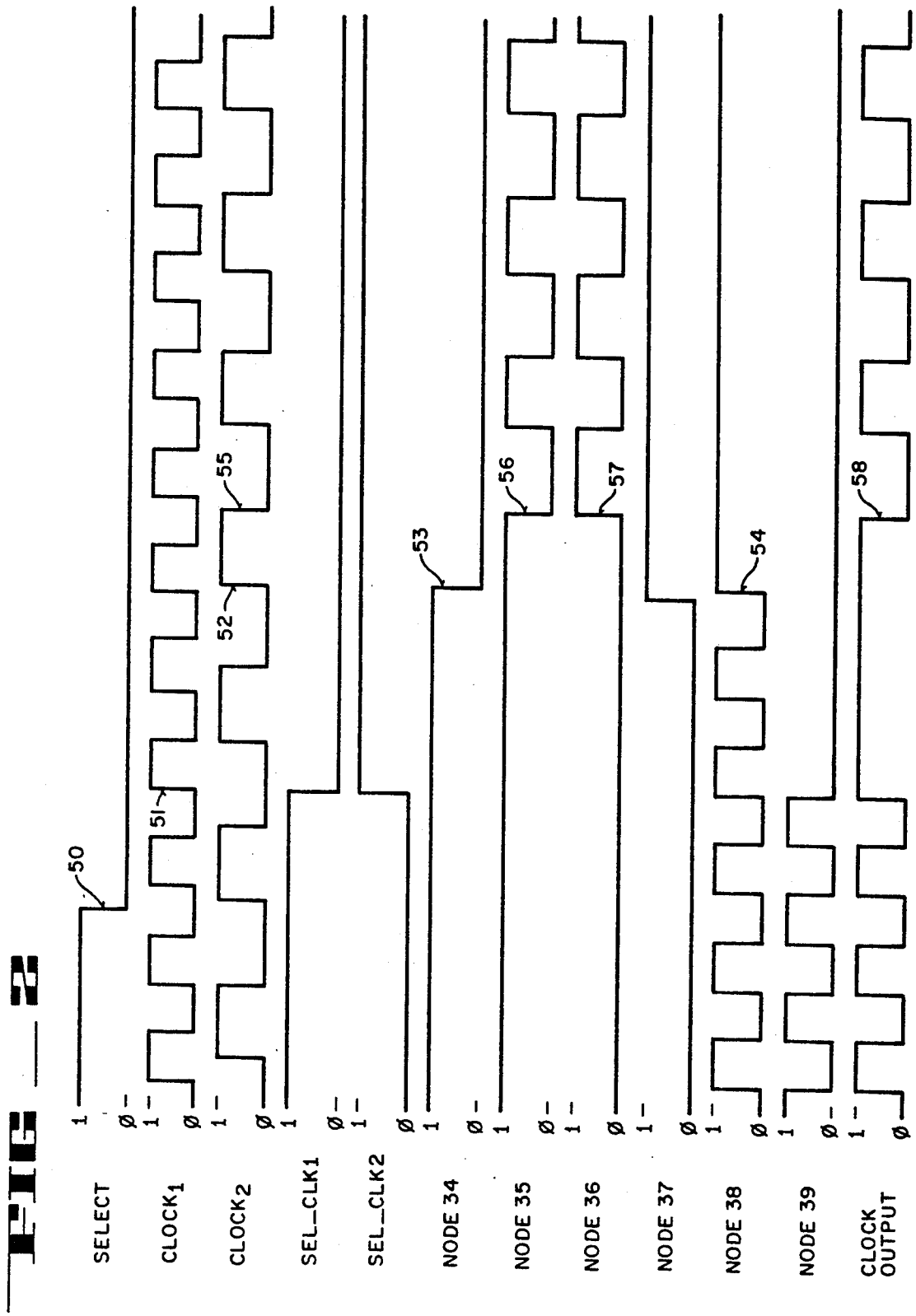

CIRCUIT FOR SYNCHRONOUS, GLITCH-FREE CLOCK SWITCHING

FIELD OF THE INVENTION

The present invention relates generally to the field of electronic switching circuits; more particularly, to circuits for switching clock signals in a synchronous manner.

BACKGROUND OF THE INVENTION

Many digital electronic circuits rely upon a clock signal to synchronize the operation of the internal and external output signals. These circuits are commonly referred to as synchronous sequential networks. The clock signal consists of a periodic series of pulses that is used to control the operation of the internal circuit elements. (e.g., gates, flip-flops, latches, etc. By way of example, clock signals are typically used in computer or digital systems to synchronize the operation of logic gates in integrated circuits to avoid the possibility of generating spurious output values. Spurious output values are caused by extrinsic hazards such as a difference in switching times between various gates, or race conditions between the internal switching components.

Most often, clock pulses are distributed throughout a computer or digital system, with the clock pulses usually being supplied from a central clock generator. To insure proper operation, it is important that the clock pulses be distributed with equal time delays to different places in a computer, because if the time delays are different, the computer may malfunction. Another way that a computer or microprocessor can malfunction is when it is supplied a clock signal which includes random or spurious oscillatory signals. These signals—commonly referred to as "glitches"—can cause a microprocessor to enter undefined modes which are catastrophic to normal program execution.

The problem of glitching clock signals is particularly acute in portable or low power computer systems. For example, laptop computers often include specialized power management circuitry for reducing the frequency of the input clock signal at times when the computer is either inactive or otherwise in a reduced power state. Because glitches are commonly generated in the clock input signal during the switching of the clock signal from a high frequency to a low frequency, and, visa versa, the computer's microprocessor can enter an undefined mode. Such undefined modes can result in the corruption of customer data as well as possible damage to the disk drive itself.

Thus, there is a need for a clock switching circuit which provides glitch-free switching between clock signals having different frequencies. As will be seen, the present invention provides a synchronous, no-glitch, clock switching apparatus which is ideally-suited for use in low-power computer and digital systems.

SUMMARY OF THE INVENTION

A circuit for synchronously selecting either a first or a second input clock signal as an output clock signal is described. In one embodiment, the invention comprises a first logic means for receiving the input clock signals as well as an internally generated control signal. The first logic means outputs the first clock signal when the internal control signal is at a first predetermined logic level. The circuit also includes a second logic means for receiving a second input clock signal and the internal control signal. The second logic means outputs the second input clock signal when the internal control signal is at a second predetermined logic level.

A control logic means receives an input select signal, which functions as an asynchronous control input to the circuit for selecting either the first or the second input clock signal as the output of the circuit. The control logic means couples the first input clock signal from the first logic means to the output when the input select signal is in a first logic state. The control logic means couples the second input clock signal from the second logic means to the output when the input select signal is in a second logic state. The control logic means generates the internal control signal in response to the input select signal. A transition of the input select signal from the first logic state to the second logic state causes the internal control signal to transition from the first predetermined logic level to the second predetermined logic level synchronous with the output clock signal. The transition first causes the control logic means to freeze the logic state of the output for a predetermined time before synchronously coupling the second input clock signal to the output such that the switching of the output clock signal from the first input clock to the second input clock signal occurs without glitching.

The invention is ideally-suited for applications in computer and digital systems which utilize power management apparatus; specifically, computer systems which rely upon a high frequency clock signal during normal operation, and a low frequency clock signal during a reduced power mode of operation.

BRIEF DESCRIPTION OF THE DRAWINGS

The present invention is illustrated by way of example and not limitation in the figures of the accompanying drawings, in which like references indicated similar elements, and in which:

FIG. 1 is a circuit schematic diagram of a current embodiment of the present invention.

FIG. 2 is a timing diagram illustrating the operation of the circuit of FIG. 1.

DETAILED DESCRIPTION

A novel circuit for synchronous, glitch-free switching of clock signals in computer and digital systems is described. In the following description, numerous specific details are set forth such as specific logic gates, circuit elements, timing relationships, etc., in order to provide a thorough understanding of the present invention. It will be obvious, however, to one skilled in the art that these specific details need not be used to practice the present invention. In other instances, well known structures and circuits have not been shown in detail in order to avoid unnecessarily obscuring the present invention.

Referring to FIG. 1 there is shown a circuit schematic diagram of a current embodiment of the present invention. Circuit 10 of FIG. 1 is capable of switching clocks without causing a glitch, and is comprised of three separate synchronizer circuits. Each synchronizer circuit comprises a pair of D-type flip-flops which function to eliminate metastable conditions due to asynchronous entry of signals relative to clock transition edges. The novel combination of the synchronizer circuits allows the switching of clock signals upon command without the possibility of hazards, race conditions, or glitches of any type on the switched output clock signal.

The first synchronizer circuit comprises flip-flops 11 and 12 coupled to receive input clock signal $CLOCK_2$ on line 30. Line 30 is also coupled to one input of OR gate 15, with the other input of OR gate 15 being coupled to the Q output of flip-flop 12 along line 34. The input to flip-flop 11 is coupled to the internal control signal $SEL\_CLK_1$ along line 41. The second synchronizer of circuit 10 comprises flip-flops 13 and 14 which have their clock inputs coupled to the input clock signal $CLOCK_1$ along line 31. Line 31 is also coupled to one input of OR gate 21. The other input of OR gate 21 is coupled to the Q output of flip-flop 14 along line 37. The data input to flip-flop 13 is also coupled to the $SEL\_CLK_1$ signal along the line 41. The $SEL\_CLK_1$ signal represents the Q output of D-type flip-flop 20.

The output of OR gate 15 is provided on line 35 to one input of NOR gate 16. Similarly, the output of OR gate 21 is coupled along line 38 to one input of NOR gate 17. As will be described shortly, lines 35 and 38 couple the input clock signals $CLOCK_2$ and $CLOCK_1$, respectively, to the clock output line 40, depending upon which clock signal has been selected.

The second input of NOR gate 16 is coupled to the $SEL\_CLK_1$ control signal along line 41. Likewise, the second input of NOR gate 17 is coupled to the $\overline{Q}$ output of flip-flop 20 along the $SEL\_CLK_2$ control signal of line 42. The output of NOR gate 16 is coupled to one input of NOR gate 18 along line 36, whereas the output of NOR gate 17 is coupled to the other input of NOR gate 18 along line 39. The output of NOR gate 18 represents the clock output of circuit 10 and is provided along line 40. Line 40 is also coupled to the clock inputs of flip-flops 19 and 20 comprising the third synchronizer of circuit 10. The data input to D-type flip-flop 19 is coupled to select line 33 which provides the asynchronous control input signal to circuit 10. The select input selects either $CLOCK_1$ or $CLOCK_2$ as the output clock signal. As previously discussed, the Q output of flip-flop 20 generates the $SEL\_CLK_1$ signal on line 41, while the $\overline{Q}$ output of flip-flop 20 generates the $SEL\_CLK_2$ signal on line 42.

It will be appreciated by practitioners in the art that the combination of two D-type flip-flops coupled in series provides a synchronizing function that eliminates metastable conditions which normally can appear in conventional logic circuits. For example, if the data input of a normal D-type flip-flop changes on the positive clock edge signal, the output could glitch momentarily, or it could enter an unstable or metastable condition for a brief time period. As previously discussed, such glitches and metastable conditions can be catastrophic for microprocessor and digital systems.

According to the present invention, the series connection of two flip-flops eliminates metastable conditions due to asynchronous entry of data signals relative to the clock edges. What happens is that even if the clock input transitions just as the data at the input changes, the Q output of the first flip-flop of the synchronizer may glitch or oscillate momentarily. However, because the Q output of the first flip-flop is coupled to the data input of the second flip-flop in the synchronizer, the data input to the second flip-flop has the whole clock period to settle. This data is often transferred to the output of the second flip-flop upon the next clock transition. Essentially, the combination of two flip-flops in series (as shown in FIG. 1) eliminates metastable conditions from occurring. The combination of the three synchronizers shown in circuit 10 provides glitch-free switching between the two input clock signals $CLOCK_1$ and $CLOCK_2$, in response to an asynchronous change in state of the input control select signal.

To better appreciate the operation of the present invention, consider the example shown by the timing diagram of FIG. 2. Initially, the select input signal on line 33 is at a logic "1" level indicating that the input clock signal $CLOCK_1$ is selected as the clock output on line 40. Note that when the input select signal on line 33 is logically high, the $SEL\_CLK_1$ control signal on line 41 is also high. Under this same condition the $SEL\_CLK_2$ control signal on line 42 is low. When line 41 is high, the data inputs to D flip-flops 11 and 13 are high. This means that the clock inputs coupled to the input flip-flops 11, 12, 13, and 14 eventually drives line 34 high and line 37 low. With line 34 high, the output of OR gate 15 (i.e., line 35) remains high. Meanwhile, because line 37 is low, the clock signal $CLOCK_1$ is passed through OR gate 21 to line 38. Because the $SEL\_CLK_2$ output of flip-flop 20 is low, NOR gate 17 passes the $CLOCK_1$ signal to line 39. At the same time, because both inputs to NOR gate 16 are high, line 36 is low. This means that NOR gate 18 simply passes the $CLOCK_1$ signal from line 39 to line 40 at the clock output of circuit 10.

When the select control input signal transitions from a high to a low logic level, as shown by transition 50 in FIG. 2, several things happen. First, the data input to flip-flop 19 is now low so that upon the second positive clock edge of the output clock signal (e.g., in this case $CLOCK_1$) the output state of flip-flop 20 will change. This is shown occurring in FIG. 2 where transition 51 causes the $SEL\_CLK_1$ and $SEL\ CLK_2$ signals to transition. The $SEL\_CLK_1$ signal on line 41 transitions from a logic "1" to a logic "0" state, whereas the $SEL\_CLK_2$ signal on line 42 transitions from a logic "0" to a logic "1" state. With line 42 at a logical high level, the output line 39 of NOR gate 17 is held at a logical low level. Because line 35 is still at a logically high level, line 36 remains at a logical low level. This means that during this transitional stage, the output of NOR gate 18 (i.e., the clock output on line 40) remains at a logical high level. (Note that the action of $CLOCK_1$ transitioning to the high state causes a similar low-to-high transition on output line 42. This results in the high state on line 38 causing the output of gate 17 to remain low, without glitching, as line 42 transitions to a logical high state.)

It will be appreciated by practitioners in the art that the length of the time that the output clock signal is frozen in this state is determined by the frequency of the $CLOCK_1$ and $CLOCK_2$ inputs, and the delay through the circuit loop of circuit 10. It is during the time that the clock output is frozen that circuit 10 synchronously switches from the first clock to the second clock frequency.

Consider now what occurs at the input synchronizer circuits once input select line 33 transitions from a logical high to a logical low level. Once line 41 transitions low, the data inputs of flip-flops 11 and 13 are also low. Upon the second positive-going transition of $CLOCK_2$, line 34 transitions from a logic "1" to a logic "0" state. The transition of line 34 from a logic 1 to a logic 0 state is shown as transition 53 in FIG. 2. Transition 53 occurs in response to transition 52 of $CLOCK_2$. Similarly, upon the second positive-going edge of $CLOCK_1$, line 37 will transition from a logic 0 to a logic 1 level.

Once lines 34 and 37 have transitioned to their new logic levels, OR gate 15 passes CLOCK$_2$ from line 30 to line 35, while NOR gate 21 blocks the propagation of the CLOCK$_1$ signal. In other words, line 38 transitions to a logic high level in response to the change of state of line 37. This is shown in FIG. 2 by transition 54. At the same time, because line 34 has transitioned low, the clock signal CLOCK$_2$ now appears on line 35. This is shown synchronously occurring in FIG. 2 at transition 56. Because the input line 41 to NOR gate 16 is now low, NOR gate 16 simply passes the signal present on line 35 to line 36. Likewise, because line 39 is now at a logic low level, NOR gate 18 passes the CLOCK$_2$ signal on line 36 to line 40. At this point, the clock output of circuit 10 is represented by the CLOCK$_2$ signal. Thus, FIG. 2 shows line 36 transitioning synchronous with the CLOCK$_2$ signal beginning at transition 57. After a small signal delay through NOR gate 18, the clock output begins outputting the clock signal CLOCK$_2$ as shown be transition 58.

Note that the switching of clock signals from the CLOCK$_1$ to the CLOCK$_2$ frequencies occurs without glitches or metastable conditions at the clock output, and with a minimum of delay. It will be appreciated by practitioners in the art that the same sort of glitch-free switching occurs when the control select input signal 33 transitions from a logic low to a logic high level. It will also be understood that one of the requirements of circuit 10 is that the signal propagation delay throughout the loop be less than one-half of the clock period of the highest frequency clock input. What this means is that the time it takes flip-flop 20 to switch (following a transition on line 40), plus the propagation delay through gates 16, 17 and 18 should be less than one-half of a clock period to insure proper operation of circuit 10 (assuming a 50% duty cycle for either CLOCK$_1$ or CLOCK$_2$). Given the current state of logic gate design, this requirement is easily met for clock signals having frequencies in excess of 100 MHz.

In summary, the operation of circuit 10 responds to the asynchronous input select signal by re-clocking two synchronizers (comprising D-type flip-flops) in order to generate a pair of stable, synchronous internal control signals (i.e., SEL—CLK$_1$ and SEL—CLK$_2$) which are used to perform the glitch-free switching of the clock inputs. These internal signals are then used to first turn off the old selected clock synchronously, and then synchronously turn on the newly selected clock input signal. During the time that the switching from one to the other clock signals occurs, the logic state of the output clock signal is held steady to avoid glitches or oscillatory conditions.

I claim:
1. A circuit for synchronously selecting either a first or second input clock signal as an output clock signal in response to an asynchronously generated select signal, said circuit comprising:
   first and second flip-flops coupled in series and clocked by said first clock signal, the data input of said flip-flop being coupled to a first internal control signal;
   third and fourth flip-flops coupled in series and clocked by said second clock signal, the data input of said third flip-flop being coupled to said first internal clock signal;
   fifth and sixth flip-flops coupled in series and clocked by said output clock signal, the data input of said fifth flip-flop being coupled to receive said select signal, said sixth flip-flop generating said first internal control signal and a second internal control signal;
   a first logic gate for gating said first clock signal with an output of said second flip-flop, and a second logic gate for gating said second clock signal with an output of said fourth flip-flop;
   a logic network comprising third, fourth, and fifth logic gates, said third logic gate having first and second inputs coupled to an output of said first logic gate and said first control signal, said fourth logic gate having first and second inputs coupled to an output of said second logic gate and said second control signal, said fifth logic gate having first and second inputs coupled to outputs of said third and fourth logic gates, an output of said fifth logic gate generating said output clock signal;
   said logic network selecting either said first or said second clock signal as said output signal in response to said first and second internal control signals, wherein when said select signal transitions from a first logic level to a second logic level, said first and second internal control signals synchronously switch logic state, thereby causing said logic network to hold said output clock signal for a predetermined time before synchronously selecting said second clock signal as said output clock signal, the switching of said output clock signal from said first to said second clock signal occurring without glitching.

2. The circuit of claim 1 wherein said first and second input clock signals have different frequencies and/or phase relationships.

3. The circuit of claim 2 wherein said first input clock signal is selected as said output clock signal when said select signal is at a logical high level.

* * * * *